(12) United States Patent
Lim et al.

(10) Patent No.: US 10,012,693 B2
(45) Date of Patent: Jul. 3, 2018

(54) SYSTEM ON CHIP AND SECURE DEBUGGING METHOD

(71) Applicant: SAMSUNG ELECTRONICS CO., LTD., Suwon-si, Gyeonggi-do (KR)

(72) Inventors: Minsoo Lim, Hwaseong-si (KR); Sungjae Lee, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 15/273,869

(22) Filed: Sep. 23, 2016

(65) Prior Publication Data

US 2017/0139008 A1    May 18, 2017

(30) Foreign Application Priority Data

Nov. 13, 2015    (KR) .................. 10-2015-0159791

(51) Int. Cl.
| | | |
|---|---|---|
| *G01R 31/28* | (2006.01) | |
| *G01R 31/317* | (2006.01) | |
| *G01R 31/3177* | (2006.01) | |
| *G01R 31/3185* | (2006.01) | |

(52) U.S. Cl.
CPC ... *G01R 31/31705* (2013.01); *G01R 31/3177* (2013.01); *G01R 31/318588* (2013.01); *G01R 31/31719* (2013.01)

(58) Field of Classification Search
None
See application file for complete search history.

(56) References Cited

U.S. PATENT DOCUMENTS

| | | | |
|---|---|---|---|
| 8,181,067 B2 | 5/2012 | McGowan | |
| 8,365,132 B2 | 1/2013 | Hsu et al. | |
| 8,489,888 B2 | 7/2013 | Lim | |
| 8,601,315 B2 | 12/2013 | Ehrlich et al. | |
| 8,819,506 B2 | 8/2014 | Ahn et al. | |
| 2003/0065984 A1 | 4/2003 | Takeda et al. | |
| 2007/0214389 A1 | 9/2007 | Severson et al. | |
| 2007/0226795 A1* | 9/2007 | Conti | G06F 21/554 726/22 |
| 2009/0202068 A1* | 8/2009 | Qureshi | H04L 9/0838 380/44 |
| 2009/0293132 A1* | 11/2009 | Henry | G06F 21/72 726/27 |
| 2013/0179701 A1 | 7/2013 | Swoboda | |
| 2015/0012737 A1* | 1/2015 | Newell | G06F 21/575 713/2 |

(Continued)

FOREIGN PATENT DOCUMENTS

| | | |
|---|---|---|
| JP | 2006011987 | 1/2006 |
| KR | 20110068498 A | 6/2011 |

*Primary Examiner* — Daniel McMahon
(74) *Attorney, Agent, or Firm* — Volentine, Whitt & Francos, PLLC

(57) ABSTRACT

A system on chip (SoC) is provided. The system on chip includes a multiprocessor that includes multiple processors, a debugging controller that includes a debug port and retention logic configured to store an authentication result of a secure joint test action group system, and a power management unit configured to manage power supplied to the multiprocessor and the debugging controller. The power management unit changes the debug port and the retention logic into an alive power domain in response to a debugging request signal.

20 Claims, 13 Drawing Sheets

(56) References Cited

U.S. PATENT DOCUMENTS

2015/0052410 A1\* 2/2015 Hyun .................... G06F 1/3287
714/727
2015/0082093 A1 3/2015 Sarangi et al.
2016/0216326 A1\* 7/2016 Lee ......................... G06F 21/74
2017/0176530 A1\* 6/2017 Cottrell ............ G01R 31/31719

\* cited by examiner

SYSTEM ON CHIP AND SECURE DEBUGGING METHOD

CROSS-REFERENCE TO RELATED APPLICATIONS

This application claims priority under 35 U.S.C. § 119 from Korean Patent Application No. 10-2015-0159791, filed on Nov. 13, 2015 in the Korean Intellectual Property Office, the disclosure of which is hereby incorporated by reference.

BACKGROUND

The present disclosure relates to a system on chip (SoC). More particularly, the present disclosure relates to aspects of a system on chip including a secure joint test action group (JTAG) system and a secure debugging method.

A system on chip (SoC) in a mobile product has become increasingly complex. For example, a mobile phone may include an application processor (AP), a modem, a global navigation satellite system (GNSS), a wireless-fidelity (Wi-Fi) device, a Bluetooth device, and multiple other integrated systems. Debuggging to verify functions of the integrated system on chip and mobile product has become important.

The system on chip performs a secure debugging operation. Only an authenticated user may perform the debugging so as to protect important security data of the system and the user. The secure debugging operation of the system on chip may be performed through a secure joint test action group system. The system on chip including the secure joint test action group system may store debug authentication information or a debug authentication result of the secure debugging operation. However, if the system on chip is in a low power mode, power supplied to the system on chip is stopped, such that important debug authentication information or an important debug authentication result can be lost. Therefore, the system on chip may not perform a continuous secure debugging operation in the low power mode.

SUMMARY

Embodiments of the present disclosure provide a system on chip (SoC) for securely maintaining debug information in a low power mode and performing a continuous secure debugging operation.

One aspect of embodiments of the present disclosure is a secure debugging method for a system on chip (SoC) that includes multiple processors. The method may include receiving a debugging request signal, changing a secure joint test action group system (JTAG) of the system on chip into an alive power domain in response to the debugging request signal, and performing secure authentication and performing a secure debugging operation according to the authenticated result in the secure joint test action group system.

Herein, the system on chip may include a multiprocessor that includes the processors, a debugging controller that includes a debug port and the secure joint test action group system, and a power management unit configured to manage power supplied to the multiprocessor and the debugging controller. The power management unit may change the debugging controller into the alive power domain in response to the debugging request signal.

Another aspect of embodiments of the present disclosure is a secure debugging method for a system on chip (SoC) that includes a multiprocessor with multiple processors, a debugging controller that includes retention logic for storing an authentication result of a secure joint test action group system (JTAG), and a power management unit configured to manage power supplied to the multiprocessor and the debugging controller. The method may include receiving a debugging request signal, changing the retention logic into an alive power domain in response to the debugging request signal, and performing secure authentication and performing a secure debugging operation according to an authenticated result in the secure joint test action group system.

Still another aspect of embodiments of the present disclosure is a system on chip (SoC). The system on chip may include a multiprocessor that includes multiple processors, a debugging controller that includes a debug port and retention logic configured to store an authentication result of a secure joint test action group (JTAG) system, and a power management unit configured to manage power supplied to the multiprocessor and the debugging controller. The power management unit may change the debug port and the retention logic into an alive power domain in response to a debugging request signal.

BRIEF DESCRIPTION OF THE FIGURES

The above and other objects and features will become apparent from the following description with reference to the following figures, wherein like reference numerals refer to like parts throughout the various figures unless otherwise specified, and wherein.

DETAILED DESCRIPTION

Figure 1:
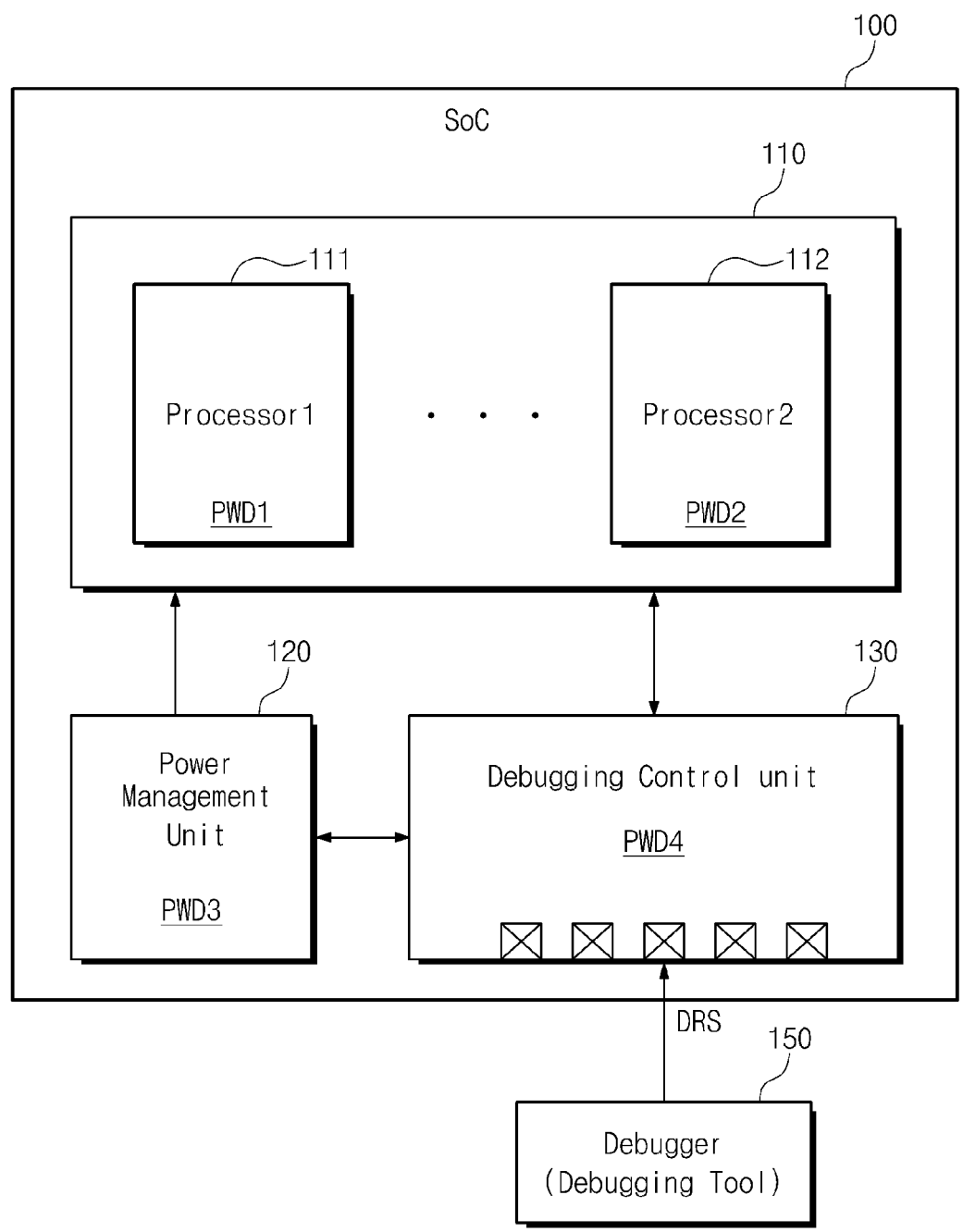
FIG. 1 is a block diagram illustrating a configuration of a system on chip (SoC) according to an exemplary embodiment of the present disclosure.

Hereinafter, exemplary embodiments of the present disclosure will be described in detail with reference to the accompanying drawings so that they may be easily practiced by those skilled in the art to which the present disclosure pertains. A system on chip (SoC) and a debugging operation FIG. 1 is a block diagram illustrating a configuration of a system on chip (SoC) according to an exemplary embodiment of the present disclosure. Referring to FIG. 1, a system on chip 100 may include a multiprocessor unit 110, a power management unit 120, and a debugging control unit 130. In FIG. 1, the system on chip 100 may be an application processor (AP).

The multiprocessor unit 110 may include heterogeneous processors, for example, an AP, a modem, a global navigation satellite system (GNSS), a digital signal processor (DSP), and the like. In FIG. 1, an exemplary embodiment of the present disclosure is exemplified as a first processor 111 is an AP and a second processor 112 is a modem.

The power management unit 120 may perform a power management operation for the multiprocessor unit 110 and the debugging control unit 130. Herein, the power management operation may refer to an operation of controlling power supplied to a specific circuit or device. For example, the power management unit 120 may perform a power management operation for the debugging control unit 130 through power-gating using a power transistor.

The power management unit 120 may perform a power management operation for the debugging control unit 130 in response to a debugging request signal (DRS). The power management unit 120 may receive the DRS from the debugger 150 through the debugging control unit 130. The power management unit 120 may keep the debugging control unit 130 powered off before receiving the DRS. If receiving the DRS, the power management unit 120 may supply power to the debugging control unit 130 to perform a debugging operation.

The debugging control unit 130 may receive the DRS from the debugger 150 (or a debugging tool) through a joint test action group system interface. The debugging control unit 130 may include a circuit (hereinafter referred to as a 'DRS circuit') which receives the DRS. Since the DRS circuit should receive the DRS from the debugger 150, it may be designed to receive power always under control of the power management unit 120.

The debugging control unit 130 may receive, as shown in FIG. 1, a joint test action group signal through multiple pins. A test data in (TDI) signal may be input to the debugging control unit 130 through a TDI pin. Also, a test clock (TCK) signal, a test reset (TRST) signal, and a test mode select (TMS) signal may be input to the debugging control unit 130 through a TCK pin, a TRST pin, and a TMS pin, respectively. A test data out (TDO) signal processed by the debugging control unit 130 may be output to the debugger 150 through a TDO pin.

Referring again to FIG. 1, the system on chip 100 may be classified into multiple power domains. The first processor 111 may operate in a first power domain PWD1, and the second processor 112 may operate in a second power domain PWD2. The power management unit 120 may operate in a third power domain PWD3, and the debugging control unit 130 may operate in a fourth power domain PWD4.

For example, the PWD3 of the power management unit 120 may be an alive power domain. Herein, the alive power domain may refer to a domain which is always maintained at a power-on state which is an electrically awakened state. The power-on state of the alive power domain may be maintained persistently through different operations that include secure authentication, secure debugging, and other operations described herein. The PWD4 of the debugging control unit 130 may be a debug power domain. Herein, the debug power domain may refer to a domain which is in the power-on state only for a debugging operation. When the system on chip 100 is changed to a low power mode, the system on chip 100 may continuously supply power in the alive power domain, but may stop power supplied in the debug power domain.

Figure 2:
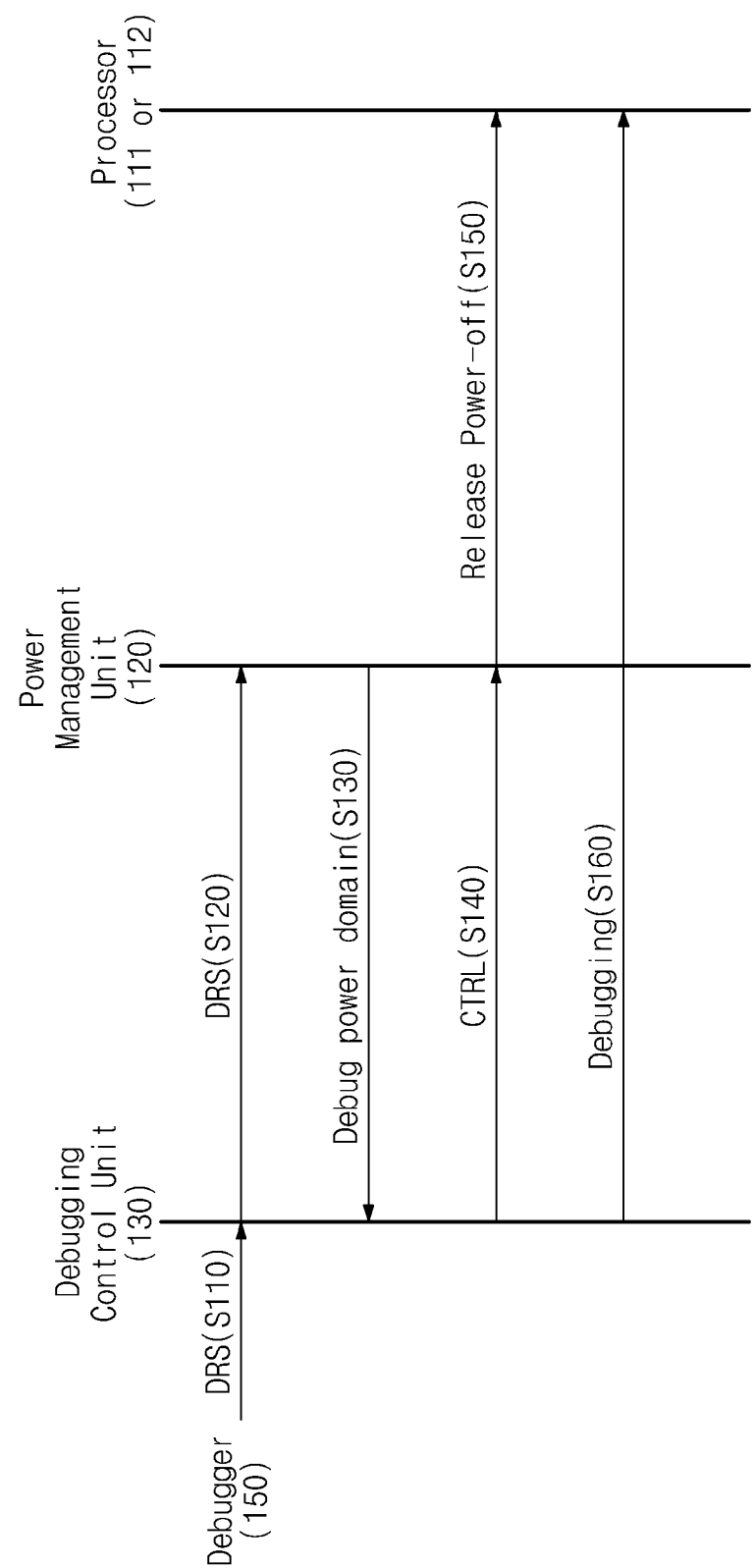
FIG. 2 is a signal sequence diagram illustrating an operation of a system on chip shown in FIG. 1 according to an exemplary embodiment of the present disclosure.

FIG. 2 is a signal sequence diagram illustrating an operation of a system on chip shown in FIG. 1 according to an exemplary embodiment of the present disclosure. Referring to FIGS. 1 and 2, in step S110, the debugging control unit 130 may receive the DRS from the debugger 150. Since receiving power always, the DRS circuit of the debugging control unit 130 may receive the DRS from the debugger 150 always. In step S120, the debugging control unit 130 may send the DRS to the power management unit 120.

The power management unit 120 may release power-off of the debugging control unit 120 in response to the DRS. In step S130, the power management unit 120 may change the debugging control unit 130 into the debug power domain. In step S140, the debugging control unit 130 which is in the debug power domain may provide a control signal CTRL to the power management unit 120. In step S150, the power management unit 120 may release power-off of a corresponding processor (e.g., the first processor 111) in response to the control signal CTRL. In step S160, the debugging control unit 130 may perform a debugging operation for the first processor 111, power-off of which is released.

Referring again to FIG. 1, multiple processors such as an AP, a modem, a GNSS may be integrated into the one system on chip 100. There is a need for security technologies for protecting important information of this system on chip. Also, it becomes more and more important to perform a debugging operation for checking functions of the processors integrated into the system on chip. The system on chip 100 may perform a secure debugging operation to use only the authenticated debugger 150. Hereinafter, a description will be given of the secure debugging operation of the system on chip 100 shown in FIG. 1.

A secure debugging operation of a system on chip that includes a secure joint test action group system.

Figure 3:
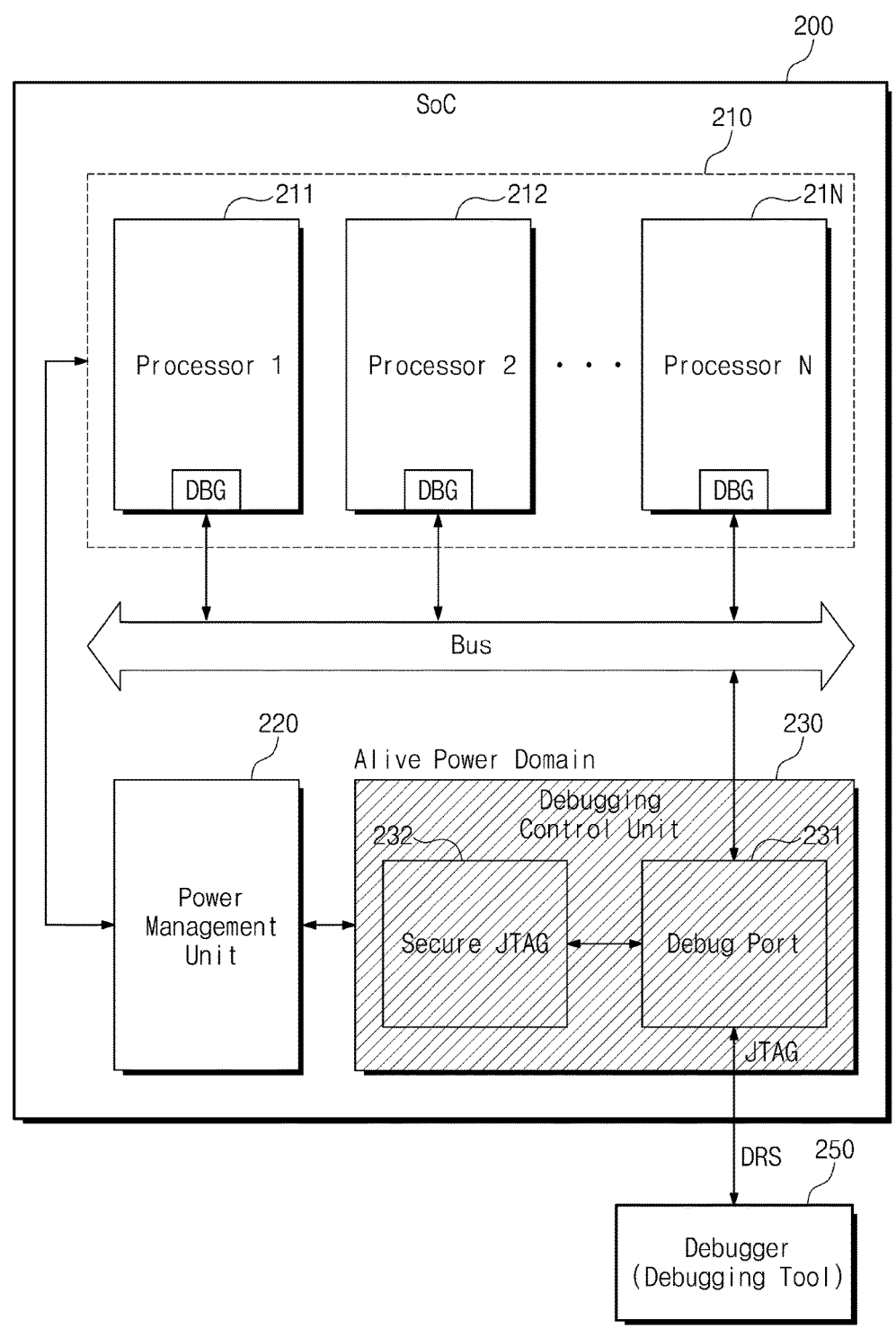
FIG. 3 is a block diagram illustrating a configuration of a system on chip according to an exemplary embodiment of the present disclosure.

FIG. 3 is a block diagram illustrating a configuration of a system on chip according to an exemplary embodiment of the present disclosure. A system on chip 200 shown in FIG. 3 may perform a secure debugging operation. The system on chip 200 may include a secure joint test action group system 232 for the secure debugging operation. Referring to FIG. 3, the system on chip 200 may include a multiprocessor unit 210, a power management unit 220, and a debugging control unit 230.

The multiprocessor unit 210 may include multiple processors 211-21N. The 211-21N may include an AP, a modem, a GNSS, a DSP, and the like. Each of the processors 211-21N may include a debug access port (DBG) for the secure debugging operation. Each of the processors 211-21N may connect with the debugging control unit 230 through a bus for the secure debugging operation.

The power management unit 220 may perform a power management operation for the multiprocessor unit 210 and the debugging control unit 230. The power management unit 220 may perform a power management operation for the debugging control unit 230 in response to a DRS. For example, the power management unit 220 may make the debugging control unit 230 be in an alive power domain in response to the DRS.

The debugging control unit 230 may include a debug port 231 and the secure joint test action group system 232. The debug port 231 may receive the DRS from a debugger 250. The debug port 231 may send the received DRS to the power management unit 220. The debugging control unit 230 may be changed into the alive power domain under control of the power management unit 220.

Figure 4:
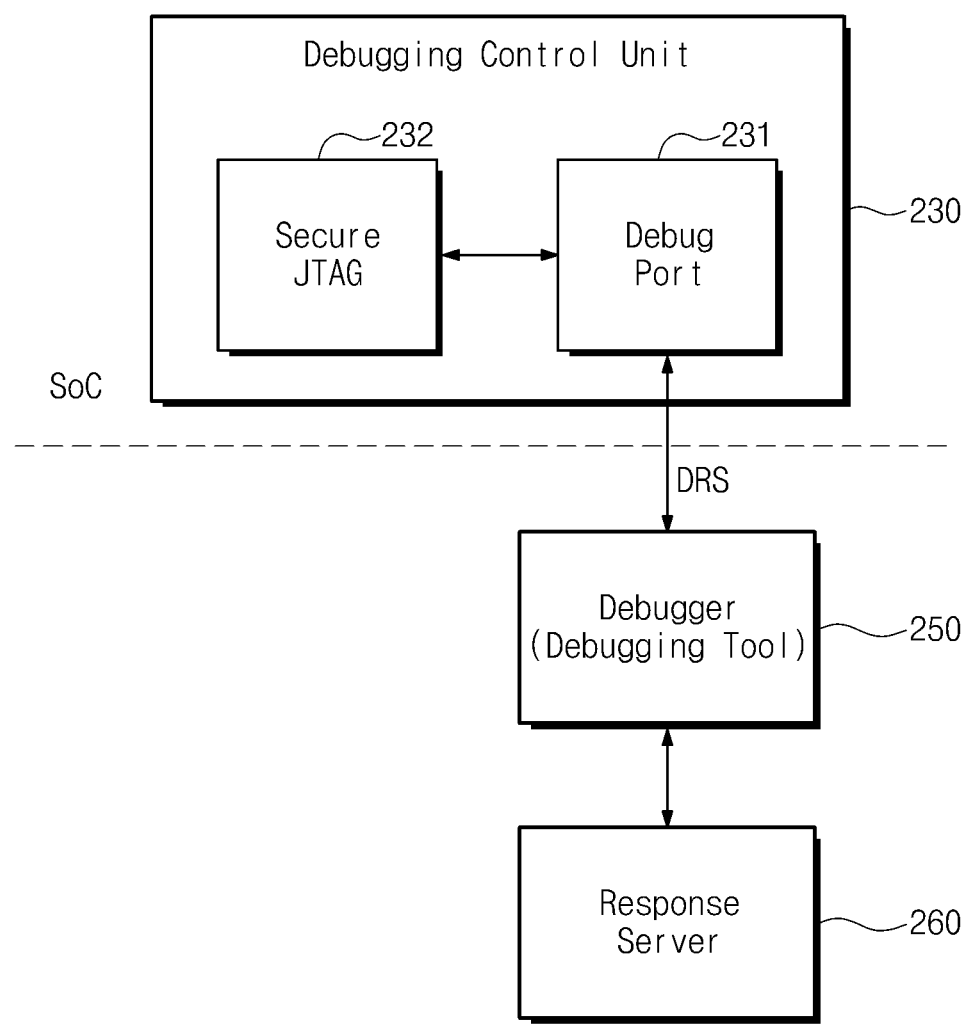
FIG. 4 is a block diagram illustrating a configuration of a debugging system for performing a secure debugging operation of a system on chip shown in FIG. 3 according to an exemplary embodiment of the present disclosure.

FIG. 4 is a block diagram illustrating a configuration of a debugging system for performing a secure debugging operation of a system on chip shown in FIG. 3 according to an exemplary embodiment of the present disclosure. The debugging system shown in FIG. 4 may perform a secure debugging operation. Referring to FIG. 4, the debugging system may include a debugging control unit 230, a debugger 250, and a response server 260. The debugging control unit 230 may include a debug port 231 and a secure joint test action group system 232. In FIG. 4, an exemplary embodiment of the present disclosure is exemplified as the response server 260 is independent of the debugger 250. However, the scope and spirit of the present disclosure may not be limited thereto. For example, the response server 260 may be included in the debugger 250.

The secure joint test action group system 232 may perform a secure debugging operation. In other words, the secure joint test action group system 232 may perform debug authentication and may control the debugger 250 to perform a secure debugging operation for a corresponding processor. A debug authentication method of the secure joint test action group system 232 may include a password authentication method and a challenge-response authentication method. The challenge-response authentication method may use a public key cryptosystem.

Figure 5:
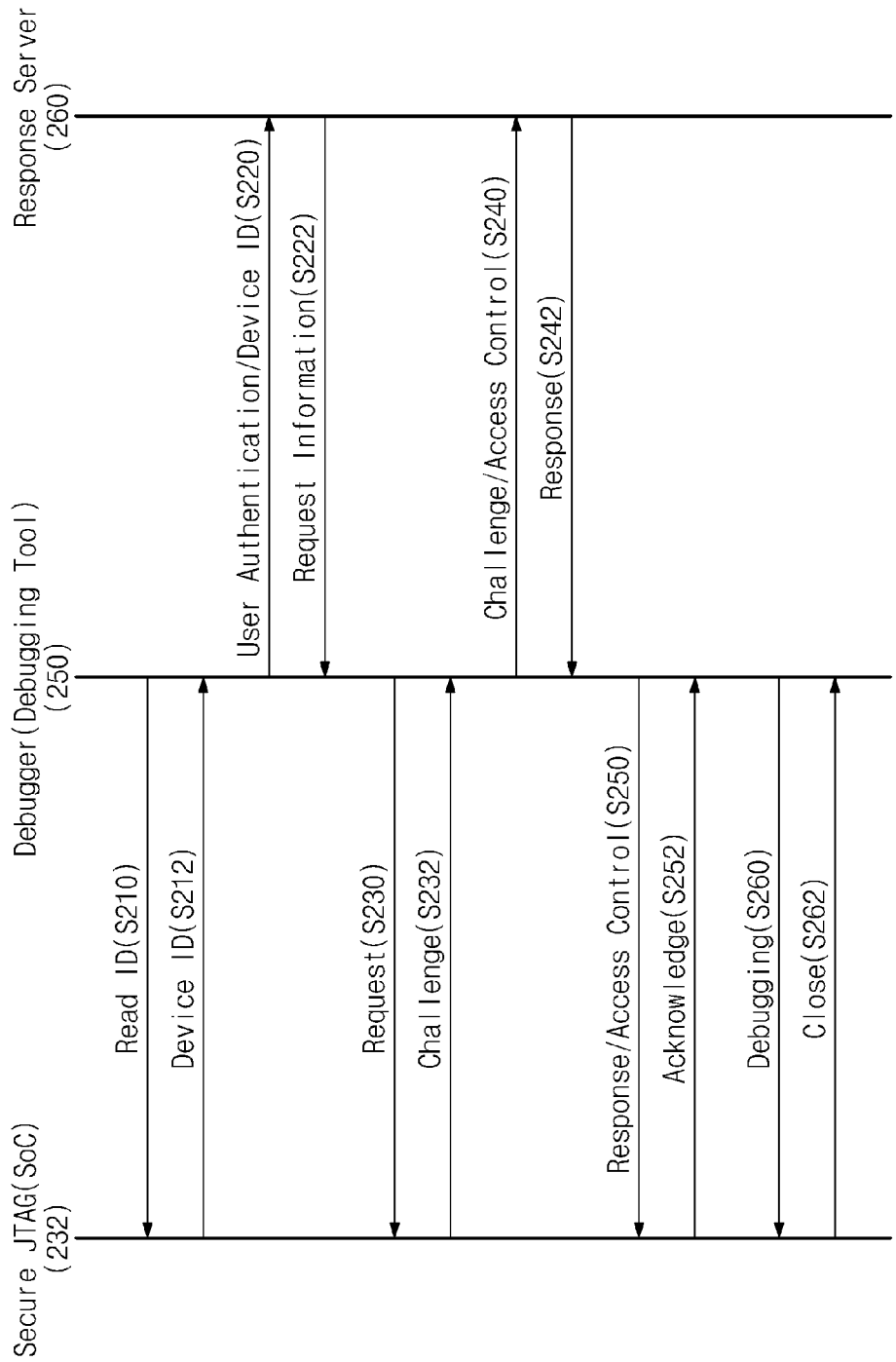
FIG. 5 is a signal sequence diagram illustrating a debug authentication method of a secure joint test action group system shown in FIG. 4 according to an exemplary embodiment of the present disclosure.

FIG. 5 is a signal sequence diagram illustrating a debug authentication method of a secure joint test action group system shown in FIG. 4 according to an exemplary embodiment of the present disclosure.

First of all, in step S210, a debugger 250 may send a request for a device ID to a secure joint test action group system 232. In step S212, the secure joint test action group system 232 may send the device ID to the debugger 250 in response to the request of the device ID. In step S220, the debugger 250 may access the response server 260 using a secure authentication method and may send a device ID of a device to be debugged to the response server 260. In step S222, the response server 260 may send request information, for requesting the device corresponding to the device ID, to the debugger 250.

In step S230, the debugger 250 may send a request to start authentication to the secure joint test action group system 232 using the request information received from the response server 260. In step S232, the secure joint test action group system 232 may verify whether the received request is received from the authorized debugger 250 and may send a challenge to the debugger 250. Herein, the challenge may be a random value.

The secure joint test action group system 232 may verify the request of the debugger 250. In other words, the secure joint test action group system 232 may have a verification means, implemented with hardware, software, or firmware, for verifying the request of the debugger 250. If the request of the debugger 250 is a public key of the response server 260, the secure joint test action group system 232 may have a certificate for the public key. If the request is a domain parameter, the secure joint test action group system 232 may have a hash code for checking integrity.

Referring again to FIG. 5, in step S240, the debugger 250 may generate access control information about the right to access a device and may send the challenge and the access control information to the response server 260. In step S242, the response server 260 may verify whether access control requested by the debugger 250 is authorized, may generate a response, and may send the generated response to the debugger 250. If the debugger 250 requests unauthorized access control, the response server 260 may deny generation of a response.

In step S250, the debugger 250 may send the response and the access control information, received from the response server 260, to the secure joint test action group system 232. The secure joint test action group system 232 may verify whether the received response is generated from the response server 260. If determining that the received response is generated from the response server 260, the secure joint test action group system 232 may send an acknowledge signal to the debugger 250. The secure joint test action group system 232 may assign right corresponding to access control. Meanwhile, if determining that the received response is not generated from the response server 260, the secure joint test action group system 232 may stop a debug authentication protocol.

Receiving the acknowledge signal from the secure joint test action group system 232, in step S260, the debugger 250 may access a device (e.g., a first processor 211 of FIG. 3) and may perform a secure debugging operation. If the secure debugging operation is ended, in step S262, the debugger 250 may send the signal that the access is closed to the debugger 250.

In a debugging system shown in FIG. 4, the secure joint test action group system 232 may authenticate the debugger 250 by a challenge-response method. Also, the secure joint test action group system 232 may provide a more secure debugging environment by granting an access to joint test action group system for the device (e.g., the first processor 211) according to the access control information. As such, in a system on chip 200 including the secure joint test action group system 232, only an authenticated user may perform a secure debugging operation.

Referring again to FIG. 3, the system on chip 200 may change a debugging control unit 230 into an alive power domain for the secure debugging operation. Although the system on chip 200 operates in a low power mode in the alive power domain, a power management unit 220 may supply an alive power to the debugging control unit 230.

The debugging control unit 230 including the secure joint test action group system 232 may be in a debug power domain for the secure debugging operation. The power management unit 220 may not supply the alive power to the debugging control unit 230 to reduce power consumption in the debug power domain. Since the power management unit 220 does not supply the alive power to the debugging control unit 230, the debugging control unit 230 may be powered off and may lose an authenticated value or result when the system on chip is changed to a low power mode. Therefore, a system on chip using a secure joint test action group system which operates in the debug power domain may not perform a secure debugging operation normally during the low power mode.

Meanwhile, the system on chip 200 shown in FIG. 3 may change the debugging control unit 230 into an alive power domain for the secure debugging operation. The power management unit 220 may provide the alive power to the debugging control unit 230 in the alive power domain. The system on chip 200 shown in FIG. 3 may securely perform the secure debugging operation without losing user authentication information in the low power mode. In other words, the system on chip 200 shown in FIG. 3 may securely perform the secure debugging operation in the low power mode by supplying the alive power to a module necessary for user authentication.

Figure 6:
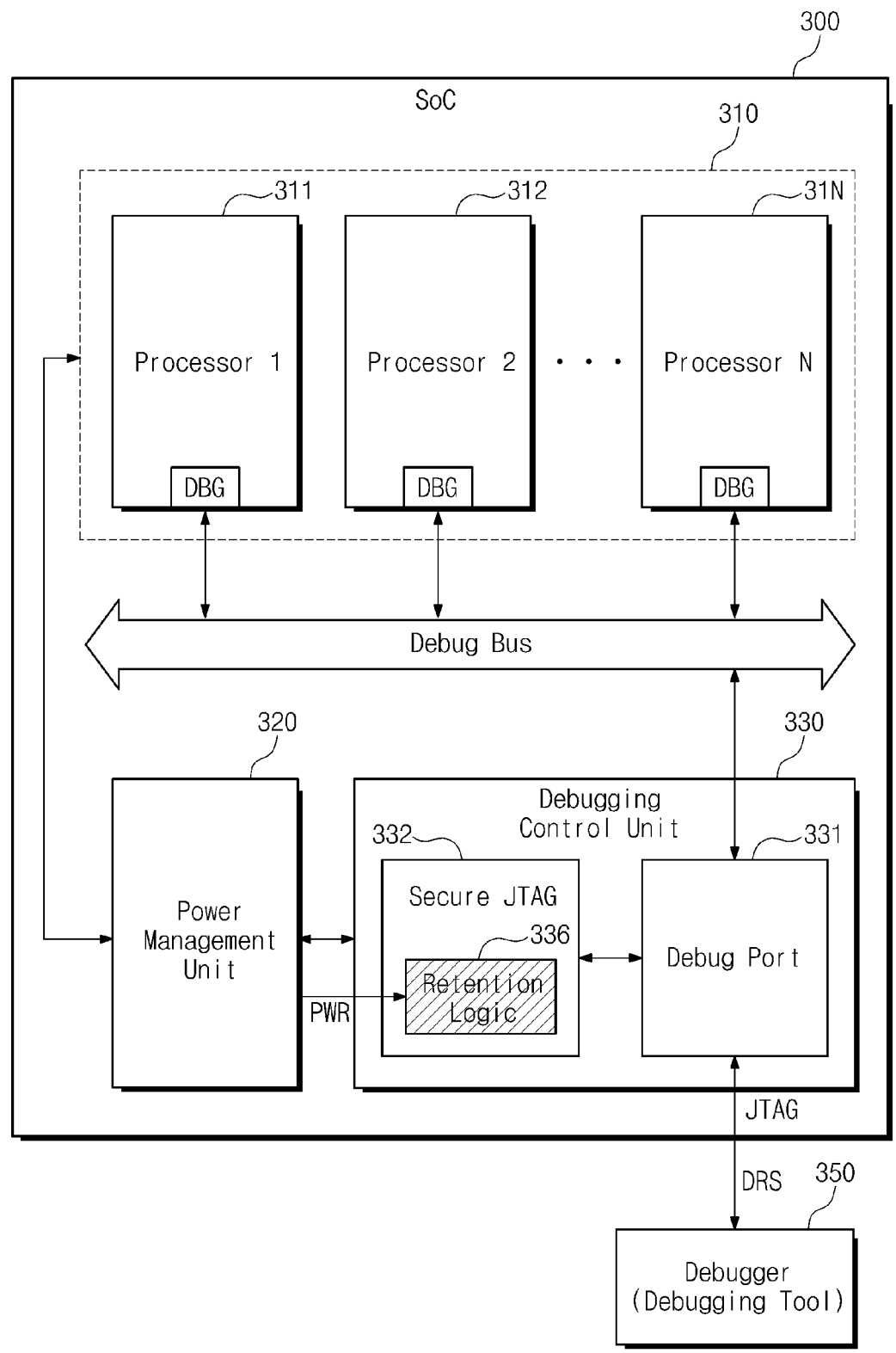
FIG. 6 is a block diagram illustrating a configuration of a system on chip according to an exemplary embodiment of the present disclosure.

FIG. 6 is a block diagram illustrating a configuration of a system on chip according to an exemplary embodiment of the present disclosure. Referring to FIG. 6, a system on chip 300 may include a multiprocessor unit 310, a power management unit 320, and a debugging control unit 330.

The multiprocessor unit 310 may include multiple processors 311 to 31N. Each of the plurality of processors 311 to 31N may include a debug access port (DBG) for a debugging operation. The power management unit 320 may perform a power management operation for the multiprocessor unit 310 and the debugging control unit 330.

The debugging control unit 330 may include a debug port 331 and a secure joint test action group system 332. The secure joint test action group system 332 may control a debugger 350 to perform a secure debugging operation after performing debug authentication. The secure joint test action group system 332 may include retention logic 336 for storing a debug authentication result. The retention logic 336 may receive a separate power PWR from the power management unit 320. Herein, the power PWR may an always-on-power which is in a power-on state always or an alive power which keeps the power-on state in a low power mode.

Figure 7:
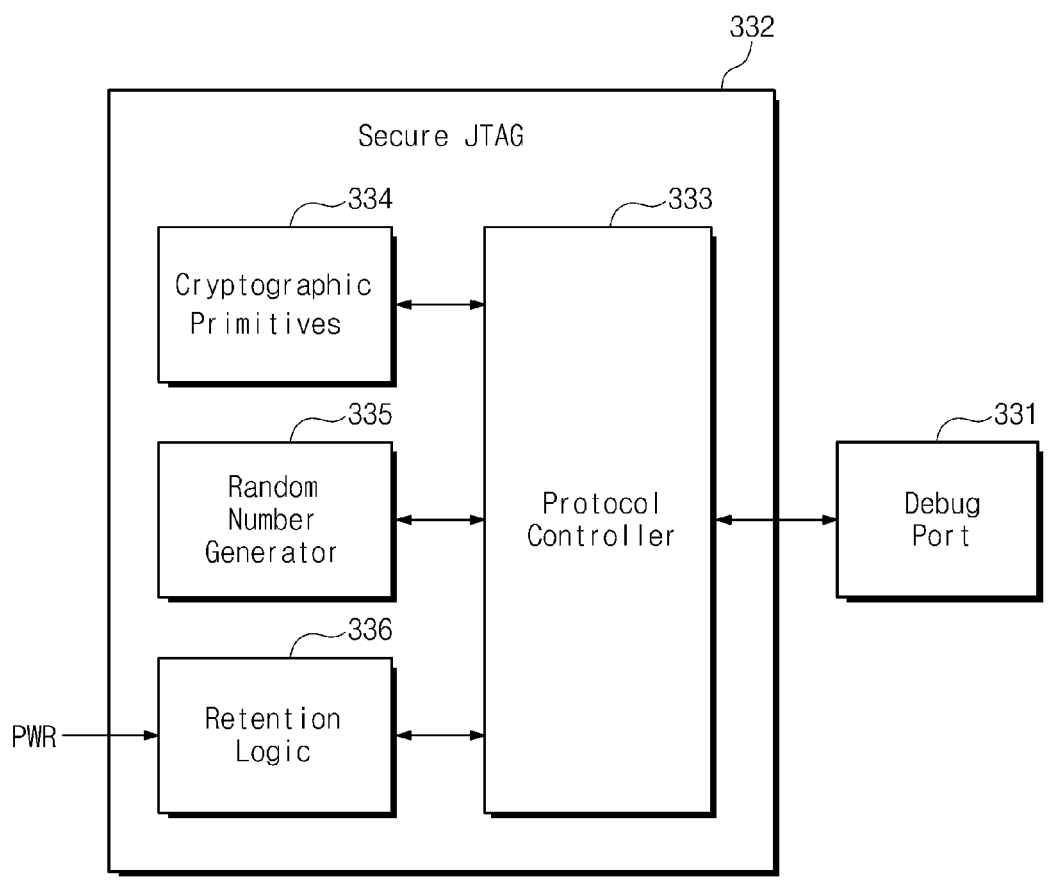
FIG. 7 is a block diagram illustrating a detailed configuration of a secure joint test action group system shown in FIG. 6 according to an exemplary embodiment of the present disclosure.

FIG. 7 is a block diagram illustrating a detailed configuration of a secure joint test action group system shown in FIG. 6 according to an exemplary embodiment of the present disclosure. Referring to FIG. 7, a secure joint test action group system 332 may include a protocol controller 333, cryptographic primitives 334, and a random generator 335, and retention logic 336. After debug authentication is completed, the secure joint test action group system 332 may control a debugger 350 of FIG. 6 to perform a secure debugging operation for a corresponding processor.

The protocol controller 333 may control a debug authentication protocol. Herein, the debug authentication protocol may be implemented with a challenge-response authentication protocol shown in FIG. 5. The cryptographic primitives 334 may be implemented to execute a hash or a public key cryptosystem. The cryptographic primitives 334 may generate a challenge by using a random number as a seed value. The random generator 335 may generate the random number as the seed value for generating the challenge.

The retention logic 336 may receive power PWR and may store a median value generated upon proceeding with an authentication protocol or an authentication result. The retention logic 336 may receive an always-on-power or an alive power from a power management unit 320 of FIG. 6 and may keep a power-on state during a secure debugging operation. The retention logic 336 may receive an always-on-power from the outside of a system on chip 300 of FIG. 6.

The retention logic 336 may generate access control signals for controlling access to each of multiple processors 311 to 31N of FIG. 6 according to access control information received from the debugger 350. The retention logic 336 may activate or inactivate joint test action group system access to each of the plurality of processors 311 to 31N.

The system on chip 300 shown in FIG. 6 may securely maintain authentication information or a debug authentication result in a low power mode. Therefore, the system on chip 300 may continuously perform a secure debugging operation in the low power mode. In other words, the system on chip 300 shown in FIG. 6 may securely perform the secure debugging operation in the low power mode by providing a separate power PWR to the retention logic 336 of the secure joint test action group system 332, which stores an authentication result.

Figure 8:
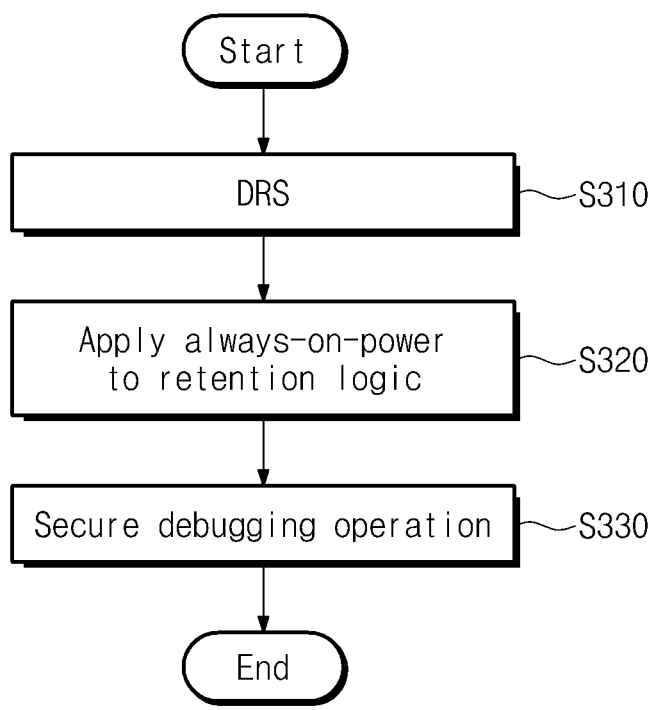
FIG. 8 is a flowchart illustrating an operation method of a system on chip shown in FIG. 6 according to an exemplary embodiment of the present disclosure.

FIG. 8 is a flowchart illustrating an operation method of a system on chip shown in FIG. 6 according to an exemplary embodiment of the present disclosure. Referring to FIG. 8, in step S310, a system on chip 300 of FIG. 6 may receive a debugging request signal (DRS) from a debugger 350 of FIG. 6. In step S320, the system on chip 300 may apply an always-on-power to retention logic 336 of a secure joint test action group system 332 of FIG. 6 in response to the DRS. Herein, the system on chip 300 may apply an alive power, for maintaining a power-on state for a secure debugging operation, to the retention logic 226, rather than the always-on-power. In step S330, the system on chip 300 may perform a secure debugging operation after performing debug authentication.

If power consumed by the secure joint test action group system 332 is increased, the system on chip 300 shown in FIG. 6 may supply power PWR to only the retention logic 336 which stores authentication information without supplying the alive power to the entire block of the secure joint test action group system 332, thus reducing power consumption. The system on chip 300 shown in FIG. 6 may securely maintain authentication information for a secure debugging operation and may reduce unnecessary power consumption.

Figure 9:
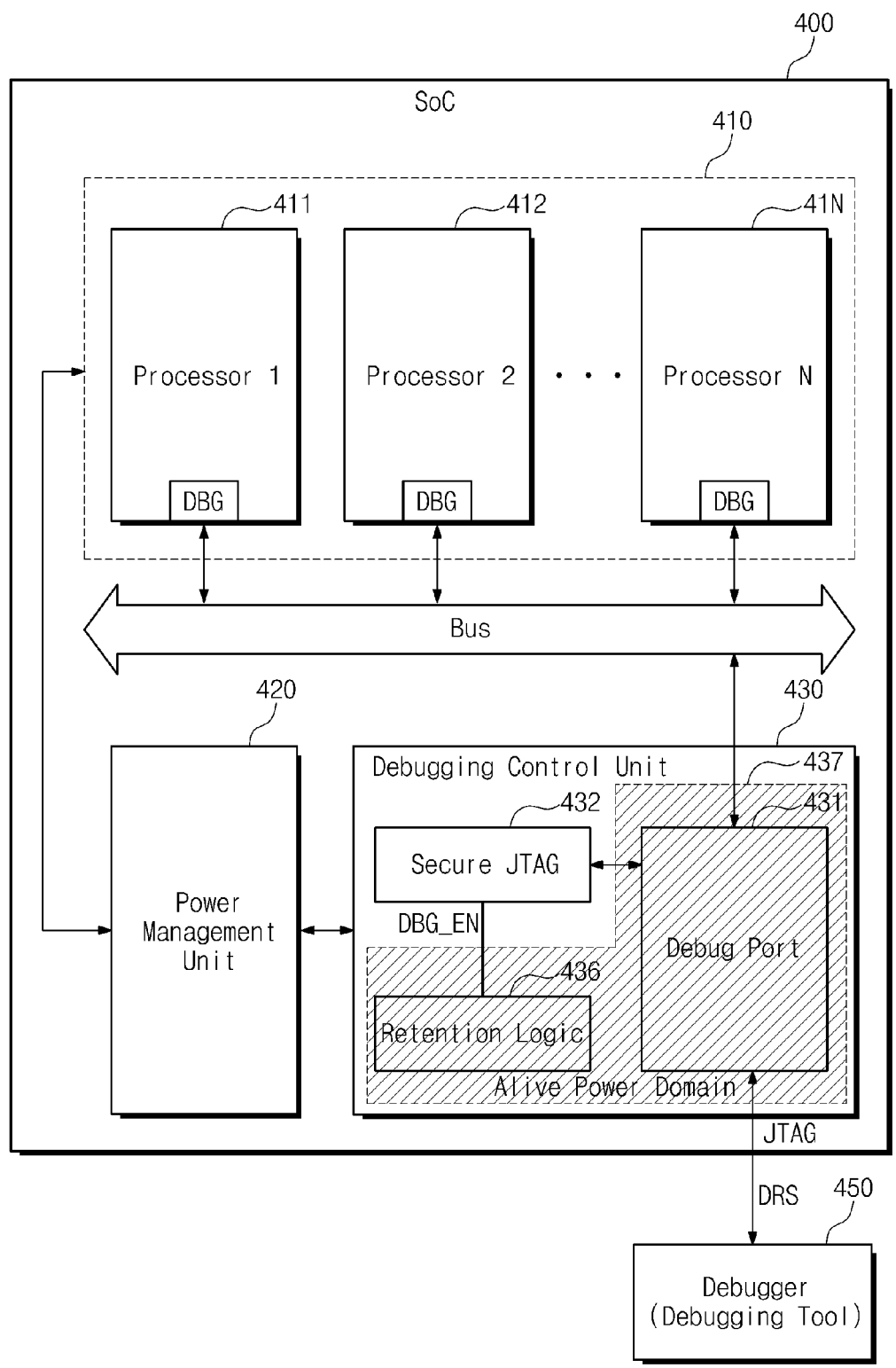
FIG. 9 is a block diagram illustrating a configuration of a system on chip according to an exemplary embodiment of the present disclosure.

FIG. 9 is a block diagram illustrating a configuration of a system on chip according to an exemplary embodiment of the present disclosure. Referring to FIG. 9, a system on chip 400 may include a multiprocessor unit 410, a power management unit 420, and a debugging control unit 430.

The multiprocessor unit 410 may include multiple processors 411 to 41N. The power management unit 420 may perform a power management operation for the multiprocessor unit 410 and the debugging control unit 430. The debugging control unit 430 may include a debug port 431, a secure joint test action group system 432, and retention logic 436. Referring to FIG. 9, the retention logic 436 may be located outside the secure joint test action group system 432.

The system on chip 400 shown in FIG. 9 may change only the debug port 431 and the retention logic 436 included in the debugging control unit 430 into an alive power domain for a debugging operation. In FIG. 9, a shaded portion indicates an alive power domain 437.

Upon a secure debugging operation, the power management unit 420 may provide an alive power to the debug port 431 and the retention logic 436. The system on chip 400 shown in FIG. 9 may securely maintain user authentication information in a low power mode, thus continuously performing the secure debugging operation.

Also, the system on chip 400 shown in FIG. 9 may include the secure joint test action group system 432 and the retention logic 436 which are independent of each other and may supply the alive power to only the retention logic 336. Therefore, if power consumed by the secure joint test action group system 432 is increased, the system on chip 400 shown in FIG. 9 may supply the alive power to only the retention logic 436 which stores authentication information, thus reducing power consumption.

Figure 10:
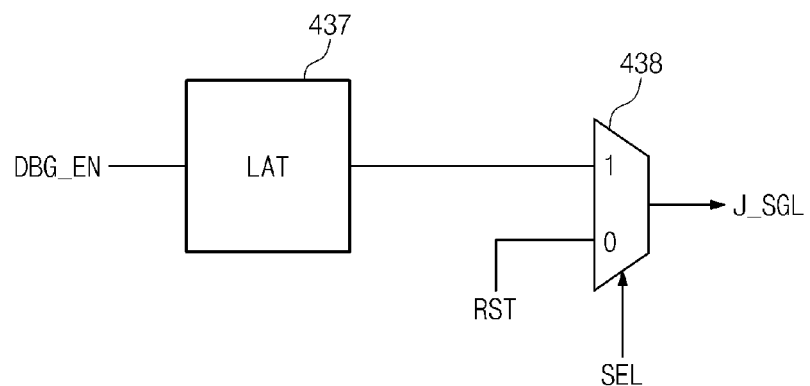
FIG. 10 is a circuit diagram illustrating a detailed configuration of retention logic shown in FIG. 9 according to an exemplary embodiment of the present disclosure.

FIG. 10 is a circuit diagram illustrating a detailed configuration of retention logic shown in FIG. 9 according to an exemplary embodiment of the present disclosure. Referring to FIG. 10, retention logic 436 may include a latch circuit 437 and a selection circuit 438. The latch circuit 437 may store an authentication result in response to a debug enable signal DBG_EN. The selection circuit 438 may selectively provide the authentication result. The selection circuit 438 may selectively provide the authentication result or a reset signal RST to a corresponding processor according to a selection signal SEL.

Figure 11:
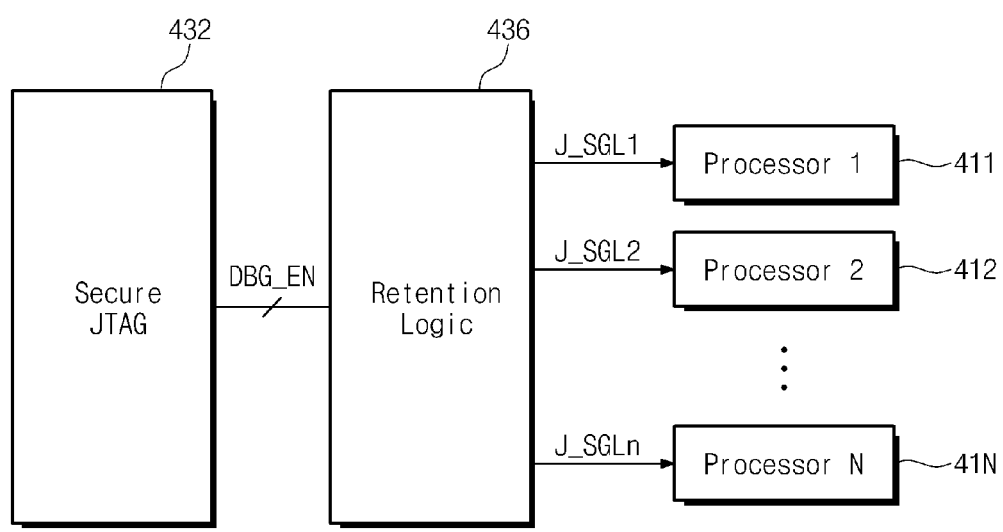
FIG. 11 is a block diagram illustrating an operation method of retention logic shown in FIG. 10 according to an exemplary embodiment of the present disclosure.

FIG. 11 is a block diagram illustrating an operation method of retention logic shown in FIG. 10 according to an exemplary embodiment of the present disclosure. Referring to FIG. 11, retention logic 436 may receive a debug enable signal DBG_EN from a secure joint test action group system 432.

The retention logic 436 may store an authentication result in response to the debug enable signal DBG_EN and may provide a joint test action group signal J_SGL to each processor. For example, the retention logic 436 may provide a first joint test action group signal J_SGL1 to a first processor 411, may provide a second joint test action group signal J_SGL2 to a second processor 412, and may provide an nth joint test action group signal J_SGLn to an nth processor 41N. Each of the first to Nth processors 411 to 41N may perform a secure debugging operation in response to the joint test action group signal J_SGL.

Figure 12:
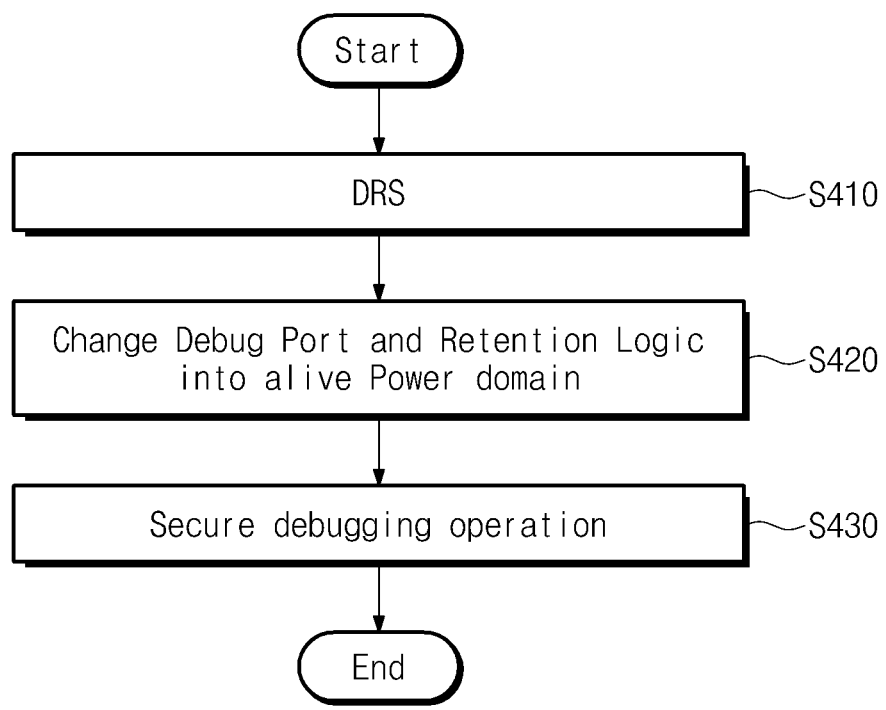
FIG. 12 is a flowchart illustrating an operation method of a system on chip shown in FIG. 9 according to an exemplary embodiment of the present disclosure.

FIG. 12 is a flowchart illustrating an operation method of a system on chip shown in FIG. 9 according to an exemplary embodiment of the present disclosure. Referring to FIG. 12, in step S410, a system on chip 400 of FIG. 9 may receive a debugging request signal (DRS) from a debugger 450 of FIG. 9. In step S420, the system on chip 400 may change a debug port 431 and retention logic 436 of FIG. 9 into an alive power domain in response to the DRS. In step S430, the system on chip 400 may perform a secure debugging operation after performing debug authentication.

If power consumed by a secure joint test action group system 432 of FIG. 9 is increased, the system on chip 400 shown in FIG. 9 may change only the retention logic 436, which stores authentication information, into the alive power domain without changing the entire block of the secure joint test action group system 432 into the alive power domain, thus reducing power consumption.

Application Example

Figure 13:
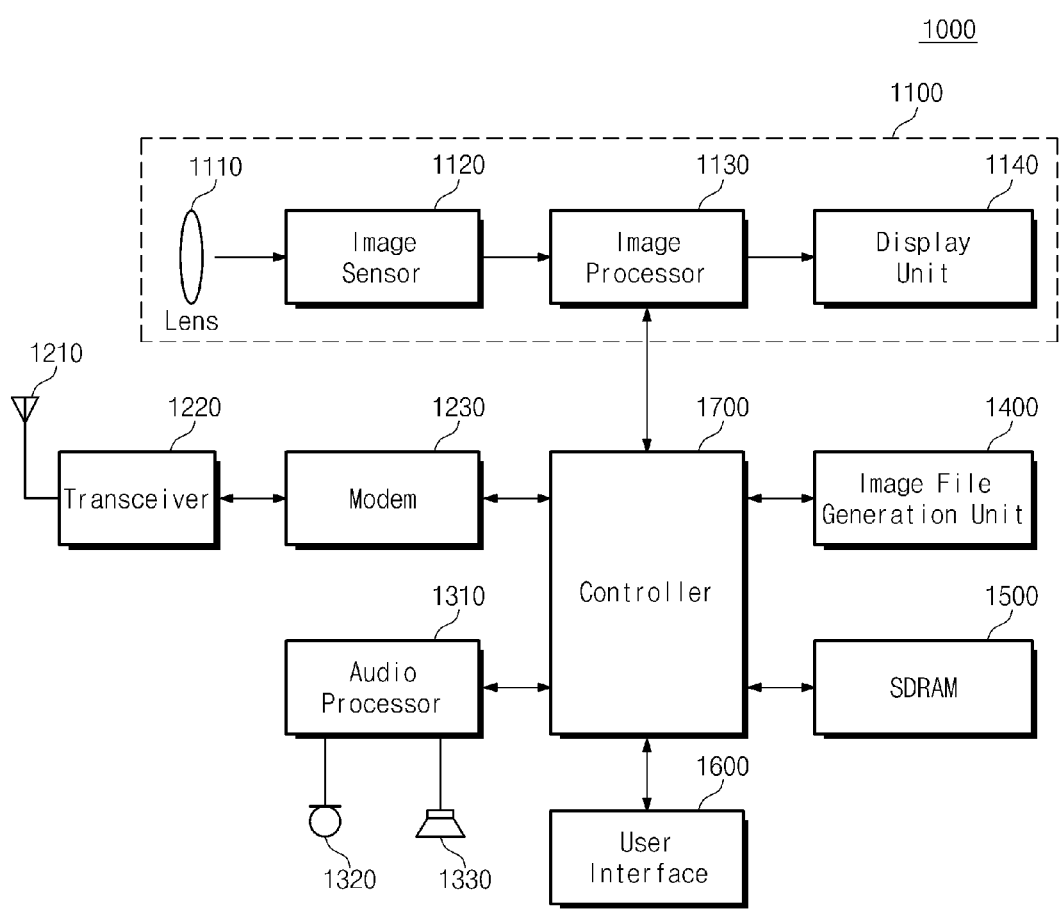
FIG. 13 is a block diagram illustrating a mobile device including a system on chip according to an exemplary embodiment of the present disclosure.

FIG. 13 is a block diagram illustrating a mobile device including a system on chip according to an exemplary embodiment of the present disclosure. Referring to FIG. 13, a portable terminal 1000 according to an exemplary embodiment of the present disclosure may include an image processing unit 1100, a wireless transmit and receive unit, an audio processing unit, an image file generating unit 1400, a static random access memory (SRAM) 1500, a user interface 1600, and a controller 1700.

The image processing unit 1100 may include a lens 1110, an image sensor 1120, an image processor 1130, and a display unit 1140. The wireless transmit and receive unit may include an antenna 1210, a transceiver 1220, and a modem 1230. The audio processing unit may include an audio processor 1310, a microphone 1320, and a speaker 1330.

The portable terminal 1000 may include various types of semiconductor devices. Particularly, a system on chip which performs a function of the controller 1700 may need a low power and high performance. Also, the system on chip may check functions of multiple systems integrated into the system on chip and may perform a secure debugging operation to be used by only an authenticated user.

If power consumed by a secure joint test action group system is increased, the system on chip may supply an alive power to only retention logic which stores authentication information without supplying the alive power to the entire block of the secure joint test action group system, thus reducing power consumption.

Figure 14:
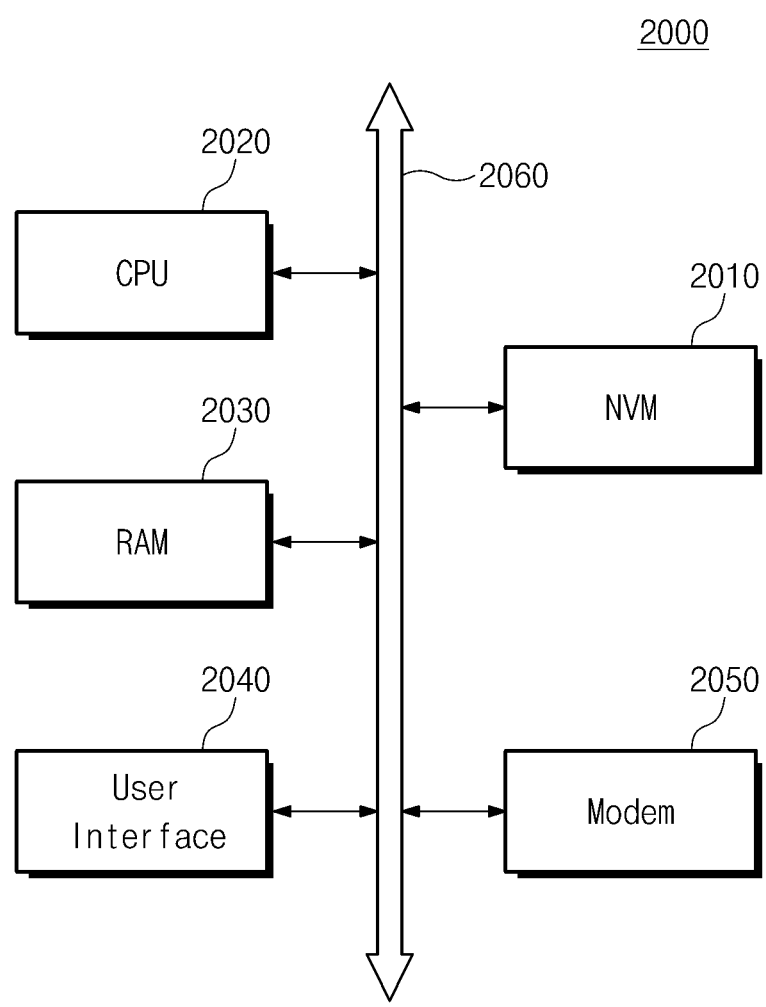
FIG. 14 is a block diagram illustrating a schematic computer system including a system on chip according to an exemplary embodiment of the present disclosure.

FIG. 14 is a block diagram illustrating a schematic computer system including a system on chip according to an exemplary embodiment of the present disclosure. Referring to FIG. 14, a computer system 2000 may include a non-volatile memory (NVM) 2010, a central processing unit (CPU) 2020, and a RAM 2030 which electrically connect to a system but 2060. The computer system 2000 may include a user interface 2040 and a modem 2050 such as a baseband chipset, which electrically connect to a system but 2060.

If the computer system 2000 according to an exemplary embodiment of the present disclosure is a mobile device, the computer system 200 may additionally include a battery (not shown) for supplying an operation voltage of the computer system 2000. Although not illustrated, it is obvious to those skilled in the art that the computer system 2000 according to an exemplary embodiment of the present disclosure may further include an application chipset, a camera image processor (CIS), a mobile dynamic RAM (DRAM), and the like.

Herein, the CPU 2020 may be implemented with the same component as at least one of components of the above-described system on chip. In other words, if power consumed by a secure joint test action group system is increased, the CPU 2020 may supply an alive power to only retention logic which stores authentication information without supplying the alive power to the entire block of the secure joint test action group system, thus reducing power consumption.

A memory system or a storage device according to an exemplary embodiment of the present disclosure may be mounted using various types of packages. The memory system or the storage device according to an exemplary embodiment of the present disclosure may be mounted using packages, such as a package on package (PoP), ball grid arrays (BGAs), chip scale packages (CSPs), a plastic leaded chip carrier (PLCC), a plastic dual in-line package (PDIP), a die in waffle pack, a die in wafer form, a chip on board (COB), a ceramic dual in-line package (CERDIP), a plastic metric quad flat pack (MQFP), a thin quad flatpack (TQFP), small outlines (SOIC), a shrink small outline package (SSOP), a thin small outline (TSOP), a thin quad flatpack (TQFP), a system in package (SIP), a multi-chip package (MCP), a wafer-level fabricated package (WFP), and a wafer-level processed stack package (WSP).

The system on chip according to an exemplary embodiment of the present disclosure may perform a debugging operation without losing user authentication information in a low power mode.

Also, if power consumed by the secure joint test action group system is increased, the SoC according to an exemplary embodiment of the present disclosure may provide the alive power to only the retention logic which stores the authentication information without providing the alive power to the entire block of the secure joint test action group system, thus reducing power consumption.

While the present disclosure has been described with reference to exemplary embodiments, it will be apparent to those skilled in the art that various changes and modifications may be made without departing from the spirit and scope of the present disclosure. Therefore, it should be understood that the above embodiments are not limiting, but illustrative.

What is claimed is:

1. A secure debugging method for a system on chip (SoC) that includes a plurality of processors, the method comprising:
receiving a debugging request signal;
changing a secure joint test action group system in a debugging controller of the system on chip into an alive power domain in response to the debugging request signal; and
performing secure authentication and performing a secure debugging operation according to a secure authenticated result in the secure joint test action group system while in the alive power domain,
wherein the alive power domain is a state in which power is supplied to the secure joint test action group system of the debugging controller without supplying the power to the entire debugging controller while the system on chip including the debugging controller operates in a low power mode.

2. The method of claim 1, wherein the system on chip comprises:
a multiprocessor that includes the plurality of processors;
the debugging controller, wherein the debugging controller includes a debug port that receives the debugging request signal, and the secure joint test action group system; and
a power management unit configured to manage power supplied to the multiprocessor and the debugging controller, and
wherein the power management unit changes the joint test action group into the alive power domain in response to the debugging request signal.

3. The method of claim 2, wherein the secure joint test action group system comprises:
retention logic configured to store a debug authentication result.

4. The method of claim 3, wherein the retention logic maintains the debug authentication result during a low power mode of the system on chip.

5. The method of claim 3, wherein the retention logic provides a joint test action group signal for performing a secure debugging operation to each of the plurality of processors included in the multiprocessor.

6. A secure debugging method for a system on chip (SoC) that includes a multiprocessor with a plurality of processors, a debugging controller that includes a secure joint test action group system and retention logic for storing an authentication result of the secure joint test action group (JTAG) system, and a power management unit configured to manage power supplied to the multiprocessor and the debugging controller, the method comprising:
receiving a debugging request signal;
changing the retention logic in the debugging controller into an alive power domain in response to the debugging request signal; and
performing secure authentication and performing a secure debugging operation according to a secure authenticated result in the secure joint test action group system, while in the alive power domain
wherein the alive power domain is a state in which power is supplied to the retention logic of the debugging controller without supplying the power to the entire debugging controller while the system on chip including the debugging controller operates in a low power mode.

7. The method of claim 6, wherein the debugging controller further comprises a debug port that receives the debugging request signal, and
wherein the power management unit changes the retention logic into the alive power domain.

8. The method of claim 7, wherein the retention logic is located outside the secure joint test action group system.

9. The method of claim 7, wherein the authentication result stored in the retention logic is provided to each of the plurality of processors included in the multiprocessor.

10. The method of claim 7, wherein the retention logic is located inside the secure joint test action group system.

11. The method of claim 10, wherein the power management unit supplies an alive power to the retention logic in response to the debugging request signal.

12. The method of claim 6, wherein the performing of the secure debugging operation according to the secure authenticated result comprises:
enabling a change from a state of no power supply to a state of power supply of a processor authenticated by the secure joint test action group system; and
performing the secure debugging operation.

13. A system on chip (SoC), comprising:
a multiprocessor that includes a plurality of processors;
a debugging controller that includes a debug port, a secure joint test action group system, and retention logic configured to store an authentication result of the secure joint test action group system; and
a power management unit configured to manage power supplied to the multiprocessor and the debugging controller,
wherein the power management unit changes the debug port and the retention logic into an alive power domain in response to a debugging request signal, and
wherein the alive power domain is a state in which power is supplied to the secure joint test action group system of the debugging controller without supplying the power to the entire debugging controller while the system on chip including the debugging controller operates in a low power mode.

14. The system on chip of claim 13, wherein the debugging controller performs secure authentication in the secure joint test action group system, stores the authentication result in the retention logic, and performs a secure debugging operation according to the authentication result of the retention logic.

15. The system on chip of claim 13, wherein the retention logic is located outside the secure joint test action group system.

16. The system on chip of claim 15, wherein the retention logic comprises:
a latch circuit configured to store the authentication result of the secure joint test action group system; and
a selection circuit configured to selectively provide the authentication result to the multiprocessor.

17. The system on chip of claim 13, wherein the secure joint test action group system comprises the retention logic.

18. The system on chip of claim 17, wherein the power management unit provides power to the retention logic in an alive power state.

19. The system on chip of claim 13, wherein the retention logic maintains the authentication result during a low power mode.

20. The system on chip of claim 13, wherein the system on chip is implemented in a mobile device.

* * * * *